(12) United States Patent
Chakraborty et al.

(10) Patent No.: US 7,186,302 B2
(45) Date of Patent: Mar. 6, 2007

(54) FABRICATION OF NONPOLAR INDIUM GALLIUM NITRIDE THIN FILMS, HETEROSTRUCTURES AND DEVICES BY METALORGANIC CHEMICAL VAPOR DEPOSITION

(75) Inventors: Arpan Chakraborty, Isla Vista, CA (US); Benjamin A. Haskell, Goleta, CA (US); Stacia Keller, Goleta, CA (US); James Stephen Speck, Goleta, CA (US); Steven P. Denbaars, Goleta, CA (US); Shuji Nakamura, Santa Barbara, CA (US); Umesh Kumar Mishra, Santa Barbara, CA (US)

(73) Assignees: The Regents of the University of California, Oakland, CA (US); The Agency of Industrial Science and Technology, Kawaguchi (JP)

( * ) Notice: Subject to any disclaimer, the term of this patent is extended or adjusted under 35 U.S.C. 154(b) by 0 days.

(21) Appl. No.: 11/123,805

(22) Filed: May 6, 2005

(65) Prior Publication Data

US 2005/0214992 A1 Sep. 29, 2005

Related U.S. Application Data

(60) Provisional application No. 60/569,749, filed on May 10, 2004.

(51) Int. Cl.
*H01L 29/04* (2006.01)

(52) U.S. Cl. .............. 148/33; 438/46; 438/47; 438/479; 438/938; 257/E21.113; 257/E21.463

(58) Field of Classification Search ................ 438/46, 438/47, 479, 938, FOR. 244, FOR. 253, 438/FOR. 287, FOR. 293; 257/E21.113, 257/E21.463; 148/33
See application file for complete search history.

(56) References Cited

U.S. PATENT DOCUMENTS 5,926,726 A 7/1999 Bour et al.

(Continued)

FOREIGN PATENT DOCUMENTS

EP 0 942 459 9/1999

(Continued)

OTHER PUBLICATIONS

Amano, H. et al., "Stress and Defect Control in GaN Using Low Temperature Interlayers," Jpn. J. Appl. Phys. vol. 37 (1998), pp. L 1540-L 1542.

(Continued)

*Primary Examiner*—George Fourson
(74) *Attorney, Agent, or Firm*—Gates & Cooper LLP

(57) ABSTRACT

A method for the fabrication of nonpolar indium gallium nitride (InGaN) films as well as nonpolar InGaN-containing device structures using metalorganic chemical vapor deposition (MOVCD). The method is used to fabricate nonpolar InGaN/GaN violet and near-ultraviolet light emitting diodes and laser diodes.

20 Claims, 6 Drawing Sheets

U.S. PATENT DOCUMENTS

| | | | |
|---|---|---|---|
| 6,051,849 | A | 4/2000 | Davis et al. |
| 6,153,010 | A | 11/2000 | Kiyoku et al. |
| 6,156,581 | A | 12/2000 | Vaudo et al. |
| 6,177,057 | B1 | 1/2001 | Purdy |
| 6,177,292 | B1 | 1/2001 | Hong et al. |
| 6,180,270 | B1 | 1/2001 | Cole et al. |
| 6,268,621 | B1 | 7/2001 | Emmi et al. |
| 6,350,666 | B2 | 2/2002 | Kryliouk |
| 6,413,627 | B1 | 7/2002 | Motoki et al. |
| 6,441,391 | B1 | 8/2002 | Ohno et al. |
| 6,468,882 | B2 | 10/2002 | Motoki et al. |
| 6,582,986 | B2 | 6/2003 | Kong et al. |
| 6,586,316 | B2 | 7/2003 | Tsuda et al. |
| 6,602,763 | B2 | 8/2003 | Davis et al. |
| 6,623,560 | B2 | 9/2003 | Biwa et al. |
| 6,635,901 | B2 | 10/2003 | Sawaki et al. |
| 6,645,295 | B1 | 11/2003 | Koike et al. |
| 6,900,070 | B2 | 5/2005 | Craven et al. |
| 2001/0029086 | A1 | 10/2001 | Ogawa et al. |
| 2002/0047113 | A1 | 4/2002 | Ohno et al. |
| 2003/0114017 | A1 | 6/2003 | Wong et al. |
| 2004/0108513 | A1 | 6/2004 | Narukawa et al. |
| 2004/0251471 | A1* | 12/2004 | Dwilinski et al. ......... 257/103 |
| 2004/0261692 | A1* | 12/2004 | Dwilinski et al. ............ 117/84 |
| 2005/0214992 | A1* | 9/2005 | Chakraborty et al. ....... 438/172 |
| 2006/0138431 | A1* | 6/2006 | Dwilinski et al. ............ 257/79 |

FOREIGN PATENT DOCUMENTS

| | | |
|---|---|---|
| JP | 2001 257166 | 9/2001 |
| JP | 2002 076329 | 3/2002 |
| JP | 2002 076521 | 3/2002 |
| WO | WO 2004/061909 | 7/2004 |
| WO | WO 2004/061969 | 7/2004 |
| WO | WO 2005/064643 | 7/2005 |

OTHER PUBLICATIONS

Wang, F. et al., "Crystal Tilting in the Epitaxial Laterally Overgrown GaN Films on Sapphire Substrate by Hydride Vapor Phase Epitaxy", Solid State and Integrated-Circuit Technology Proceedings, 6th International Conference, Oct. 2001, vol. 2, pp. 1998-1201.

Maruska, H.P. et al., "Development of 50 mm Diameter Non-Polar Gallium Nitride Substrates for Device Applications", International Conference on Indium Phosphide and Related Materials, May 16, 2003, pp. 567-570.

Craven, M.D., et al., "Structural characterization of nonpolar (1120) α-plane GaN thin films grown on (1102) r-plane sapphire", Applied Physics Letters, vol. 81, No. 3, Jul. 15, 2002, pp. 469-471, XP002250684.

Dupuis, R.D., et al., "Selective-area and lateral epitaxial overgrowth of III-N materials by metalorganic chemical vapor deposition", Journal of Crystal Growth, vol. 195, No. 1-4, Dec. 15, 1998, pp. 340-345, XP004154285.

Grzegory, I., et al., "Seeded growth of GaN at high $N_2$ pressure on (0 0 0 1) polar surfaces of GaN single crystalline substrates", Materials Science in Semiconductor Processing, vol. 4, No. 6, Dec. 2001, pp. 535-541, XP004345737.

Liu, L. et al., "Substrates for gallium nitride epitaxy", Materials Science and Engineering R, Reports: A Review Journal, vol. 37, No. 3, Apr. 30, 2002, pp. 61-127, XP004349792.

Marchand, H., et al., "Mechanisms of lateral epitaxial overgrowth of gallium nitride by metalorganic chemical vapor deposition", Journal of Crystal Growth, vol. 195, No. 1-4, Dec. 15, 1998, pp. 328-332, XP004154283.

Mills, Alan, "Wide-bandgap emitters continue to improve", III-Vs Review, vol. 13, No. 3, May 2000, pp. 23-24, 26, 28-30, XP004200697.

Sasaki, T., et al., "Substrate-orientation dependence of GaN single-crystal films grown by metalorganic vapor-phase epitaxy", Journal of Applied Physics, American Institute of Physics, vol. 61, No. 7, Apr. 1, 1987, pp. 2533-2540, XP000820119.

Sun, Chien-Jen, et al., "Comparison of the physical properties of GaN thin films deposited on (0001) and (0112) sapphire substrates", Applied Physics Letters, vol. 63, No. 7, 1993, pp. 973-975, XP002251480.

Amano, H., et. al., "Metalorganic vapor phase epitaxial growth of a high quality GaN film using an AlN buffer layer" Appl. Phys. Lett. 48 (5), Feb. 3, 1986, pp. 353-355.

Ambacher, O., et. al., "Two-dimensional electron gases induced by spontaneous and piezoelectric polarization charges in N- and Ga-face AlGaN/GaN heterostructures" J. Appl. Phys., 85 (6), Mar. 15, 1999, pp. 3222-3233.

Bottcher, T., et al., "The role of high-temperature island coalescence in the development of stresses in GaN films" Appl. Phys. Lett. 78 (14), Apr. 2, 2001, pp. 1976-1978.

Brandt, O., et al., "Determination of strain state and composition of highly mismatched group-III nitride heterostructures by x-ray diffraction" J. Phys. D. Appl. Phys. 35 (2002), pp. 577-585.

Craven, M.D., et al., "Characterization of a-Plane GaN/(Al,Ga)N Multiple Quantum Wells Grown via Metalorganic Chemical Vapor Deposition" Jpn. J. Appl. Phys. Vol. 42, (2003), pp. L235-L238.

Craven, M.D., et al., "Threading dislocation reduction via laterally overgrown nonpolar (1120) a-plane GaN" Appl. Phys. Lett. 81 (7), Aug. 12, 2002, pp. 1201-1203.

Dovidenko, K., et. al., Characteristics of stacking faults in AlN thin films J. Appl. Phys. 82 (9), Nov. 1, 1997, pp. 4296-4299.

Eastman, L.F., "The Toughest Transistor Yet" IEEE Spectrum 39 (5), May 2002, pp. 28-33.

Eddy, C.R., Jr., "Growth of gallium nitride thins films by electron cyclotron resonance microwave plasma-assisted molecular beam epitaxy" J. Appl. Phys. 73 (1), Jan. 1, 1993, pp. 448-455.

Etzkorn, E.V., et al., "Cracking of GaN films" J. Appl. Phys. 89 (2), Jan. 15, 2001, pp. 1025-1034.

Freitas, J. A., Jr., et al., "Optical characterization of lateral epitaxial overgrown GaN layers" Appl. Phys. Lett. 72 (23), Jun. 8, 1998, pp. 2990-2992.

Grandjean, N., et al., "Built-in electric-field effects in wurtzite AlGaN quantum wells" J. Appl. Phys. 86 (7), Oct. 1, 1999, pp. 3714-3720.

Heying, B., et al., "Role of threading dislocation structure on the x-ray diffraction peak widths in epitaxial GaN films" Appl. Phys. Lett. 68 (5), Jan. 29, 1996, pp. 643-645.

I. J. Seo, et. al., "Reduction of oscillator strength due to piezoelectric fields in GaN/$Al_xGa_{1-x}$N quantum wells" Phys. Rev. B. 57 (16), Apr. 15, 1998-II, pp. R9435-R9438.

Iwata, K., et. al., "Gas Source Molecular Beam Epitaxy Growth of GaN on C-, A-, R-, and M-Plane Sapphire and Silica Glass Substrates" Jpn. J. Appl. Phys. vol. 36 (1997), pp. L 661-L664.

Kapolnek, D., et al., "Anisotropic epitaxial lateral growth in GaN selective area epitaxy" Appl. Phys. Lett. 71 (9), Sep. 1, 1997, pp. 1204-1206.

Langer, R., et. al., "Giant electric fields in unstrained GaN single quantum wells" Appl. Phys. Lett., 74 (25), Jun. 21, 1999, pp. 3827-3829.

Lefebvre, P. et al., "High internal electric field in a graded-width InGaN/GaN quantum well: Accurate determination by time-resolved photoluminescence spectroscopy" Appl. Phys. Lett. 78 (9), Feb. 26, 2001, pp. 1252-1254.

Lefebvre, P., et al., "Time-resolved photoluminescence as a probe of internal electric fields in GaN-(GaAl)N quantum wells" Phys. Rev. B. 59 (23), Jun. 15, 1999-I, pp. 15363-15367.

Lei, T., "Heteroepitaxy, polymorphism, and faulting in GaN thin films on silicon and sapphire substrates" J. Appl. Phys. 74 (7), Oct. 1, 1993, pp. 4430-4437.

Leroux, M., "Barrier-width dependence of group-III nitrides quantum-well transition energies" Phys. Rev. B. 60 (3), Jul. 15, 1991-I, pp. 1496-1499.

Leszczynski, M., et. al., "Lattice parameters of gallium nitride" Appl. Phys. Lett. 69 (1), Jul. 1, 1996, pp. 73-75.

Marchand, H., et al., "Microstructure of GaN laterally overgrown by metalorganic chemical vapor deposition" Appl. Phys. Lett.. 73 (6), Aug. 10, 1998, pp. 747-749.

Marchand, H., et al., "Atomic force microscopy observation of threading dislocation density reduction in lateral epitaxial overgrowth of gallium nitride by MOCVD" MRS Internet J. Nitride Semicond. Res. 3, 3 (1998), pp. 1-7.

Metzger, Th., et. al., "X-Ray Diffraction Study of Gallium Nitride Grown by MOCVD" Physica status solidi (b) 193, 1996, pp. 391-397.

B. Monemar, et. al., "Properties of Zn-doped VPE-grown GaN.I. Luminescence data in relation to doping conditions" J. Appl. Phys. 51 (1), Jan. 1980, pp. 625-639.

Moustakas, T.D., et. al., "Growth of GaN by ECR-assisted MBE" Physica B 185, 1993, pp. 36-49.

Motoki, J., et al., "Preparation of Large Freestanding GaN Substrates by Hydride Vapor Phase Epitaxy Using GaAs as a Starting Substrate" Jpn. J. Appl. Phys. vol. 40 (2), (2001), pp. L140-L143.

Nakamura, S, et. al., "Violet InGaN/GaN/AlGaN-Based Laser Diodes Operable at 50° C. with a Fundamental Transverse Mode" Jpn. J. Appl. Phys. 38 (2), 1999, pp. L226-L229.

Nam, O., et. al., "Lateral epitaxy of low defect density GaN layers via organometallic vapor phase epitaxy" Appl. Phys. Lett. 71 (18), Nov. 3, 1997, pp. 2638-2640.

Nataf, G., et. al., "Lateral overgrowth of high quality GaN layers on GaN/$Al_2O_3$ patterned substrates by halide vapour-phase epitaxy" J. of Crystal Growth (192), Feb. 20, 1998, pp. 73-78.

Ng, H. M., "Molecular-beam epitaxy of GaN/$Al_xGa_{1-x}$N multiple quantum wells on R-plane (1012) sapphire substrates" Appl. Phys. Lett. 80 (23), Jun. 10, 2002, pp. 4369-4371.

Nishida, T., et al., "Ten Milliwatt Operation of an AlGaN-Based Light Emitting Diode Grown on GaN Substrate" Phys. Stat. Sol. (a) 188 (1), 2001, pp. 113-116.

Park, S., et. al., "Spontaneous polarization effects in wurtzite GaN/AlGaN quantum wells and comparison with experiment" Appl. Phys. Lett. 76 (15), Apr. 10, 2000, pp. 1981-1983.

Park, J., et. al., "Selective-area and lateral epitaxial overgrowth of III-N materials by metal organic chemical vapor deposition" Appl. Phys. Lett. 73 (3), Jul. 20, 1998, pp. 333-335.

Parilliaud, O., et al., "Localized Epitaxy of GaN by HVPE on patterned Substrates" MRS Internet J. Nitride Semicond. Res. 3 (40), Oct. 19, 1998, pp. 1-9.

Paskova, T., et al., "Defect Reduction in HVPE Growth of GaN and Related Optical Spectra" Phys. Stat. Sol. (a) 183, (2001), pp. 197-203.

Rosner, S.J., et. al., "Cathodoluminescence mapping of epitaxial lateral overgrowth in gallium nitride" Appl. Phys. Lett. 74 (14), Apr. 5, 1999, pp. 2035-2037.

Sakai, A., et al., "Self-organized propagation of dislocations in GaN films during epitaxial lateral overgrowth" Appl. Phys. Lett. 76 (4), Jan. 24, 2000, pp. 442-444.

Sano, M., et al., "Epitaxial Growth of Undoped and Mg-Doped GaN" Jpn. J. of Appl. Phys. 15 (10), Oct. 1976, pp. 1943-1950.

Shintani, A., et al. "Light Emitting Patterns of Gallium Nitride Electroluminescence" J. Electrochem. Soc. 123 (10), Oct. 1976, pp. 1575-1578.

Smorchkova, I.P., et. al., "Polarization-induced charge and electron mobility in AlGaN/GaN heterostructures grown by plasma-assisted molecular-beam epitaxy" J. Appl. Phys. 86 (8), Oct. 15, 1999, pp. 4520-4526.

Takeuchi, T., et. al., "Determination of piezoelectric fields in strained GaInN quantum wells using the quantum-confined Stark effect" Appl. Phys. Lett. 73 (12), Sep. 21, 1998, pp. 1691-1693.

Takeuchi, T., et. al., "Quantum-Confined Stark Effect due to Piezoelectric Fields in GaInN Strained Quantum Wells" Jpn. J. Appl. Phys. vol. 36, Apr. 1, 1997, pp. L382-385.

Tan, I-H., et. al., "A self consistent solution of Schrodinger-Poisson equations using a nonuniform mesh" J. Appl. Phys. 68 (8), Oct. 15, 1990, pp. 4071-4076.

Tsuchiya, H., et al., "Growth condition dependence of GaN crystal structure on (0 0 1)GaAs by hydride vapor-phase epitaxy" J. of Crystal Growth (189/190), 1998, pp. 395-400.

Waltereit, P., et. al., "Nitride semiconductors free of electrostatic fields for efficient white light-emitting diodes" Nature vol. 406, Aug. 24, 2000, pp. 865-868.

Wright, A.F., "Elastic properties of zinc-blende and wurtzite AlN, GaN, and InN" J. Appl. Phys. 82 (6), Sep. 15, 1997, pp. 2833-2839.

Yablonovitch, E., et. al., "Reduction of Lasing Threshold Current Density by the Lowering of Valence Band Effective Mass" J. of Lightwave Tech. vol. LT-4 (5), May 1986, pp. 504-506.

Zheleva, T., et. al., "Dislocation density reduction via lateral epitaxy in selectively grown GaN structures" Appl. Phys. Lett. 71 (17), Oct. 27, 1997, pp. 2472-2474.

Zheleva, T., et. al., "Pendo-epitaxy— A new approach for lateral growth of gallium nitride structures" MRS Internet J. Nitride Semicond. Res. 4S1, G3.38 (1999).

Yu., Z., et. al., "Epitaxial lateral overgrowth of GaN on SiC and sapphire substrates" MRS Internet J. Nitride Semicond. Res. 4S1, G4.3 (1999).

Kinoshita et al., "Emission Enhancement of GaN/AlGaN Single-Quantum-Wells Due to Screening of Piezoelectric Field", MRS Internet J. Nitride Semicond. Res. 5, W11.32 (2000).

Leroux et al., "Quantum confined Stark effect due to built-in internal polarization fields in (Al,Ga)N/GaN quantum wells", Phys. Rev. B 58, R113371 (1998).

Kuokstis et al., "Polarization effects in photoluminescence of C- and M-plane GaN/AlGaN multiple quantum wells", Appl. Phys. Lett. 81, 4130 (2002).

Bhattacharyya et la., "Comparative study of GaN/AlGaN MQWs grown homoepitaxially on (1 1 0 0) and (0001) GaN", Crystal Growth 251, 487 (2003).

Bernardini et al., "Spontaneous polarization and piezoelectric constants of III-V nitrides", Phys. Rev. B 56, R10024 (1997).

Langer et al., "Giant electric fields in unstrained GaN single quantum wells", Appl. Phys. Lett. 74, 3827 (1999).

Traetta et al., "Effects of the spontaneous polarization and piezoelectric fields on the luminescence spectra of GaN/$Al_{0.15}Ga_{0.85}$N quantum wells", Physica E 7, 929-933 (2000).

Keller et al., "Metalorganic Chemical Vapor Deposition Growth of High Optical Quality and High Mobility GaN", J. Electronic Materials vol. 24, pp. 1707-1709 (1995).

Chakraborty et al., "Nonpolar InGaN/GaN emitters on reduced-defect lateral epitaxially overgrown a-plane GaN with drive-current-independent electroluminescence emission peak", Applied Physics Letters vol. 85 No. 22, (Nov. 29, 2004).

Chitnis et al., "Visible light-emitting diodes using a-plane GaN-InGaN multiple quantum wells over r-plane sapphire", Applied Physics Letters vol. 84 No. 18 (May 3, 2004).

Gardner et al., "Polarization anisotropy in the electroluminescence of m-plane InGaN-GaN multiple-quantum-well light-emitting diodes", Applied Physics Letters 86, 111101 (2005).

Vanfleet et al., "Defects in m-face GaN films grown in halide vapor phase epitaxy on $LiAlO_2$", Applied Physics Letters, vol. 83 No. 6 (Aug. 11, 2003).

Haskell et al., "Defect reduction in (1120) a-plane gallium nitride via lateral epitaxial overgrowth by hydride vapor-phase epitaxy", Applied Physics Letters, vol. 83 No. 4 (Jul. 28, 2003).

Yue Jun Sun et al., "In surface segregation in M-plane (In,Ga)N/GaN multiple quantum well structures", Applied Physics Letters, vol. 83 No. 25 (Dec. 22, 2003).

Bigenwald et al., "Confined Excitons in GaN-AlGaN Quantum Wells", Phys. Stat. Sol. (b) 216, 371 (1999).

Im, J.S. et al., "Reduction of oscillator strength due to piezoelectric fields in GaN/$Al_xGa_{1-x}$N quantum wells", Phys. Rev. B, vol. 57 No. 16 (Apr. 15, 1998).

Nam, Ok-Hyun et al., "Lateral epitaxy of low defect density GaN layers via organometallic vapor phase epitaxy", Appl. Phys. Lett. 71 (18) (Nov. 3, 1997).

Zheleva et al., "Dislocation density reduction via lateral epitaxy in selectively grown GaN structures", Appl. Phys. Lett. 71 (17) (Oct. 27, 1997).

Yue Jun Sun et al., "Nonpolar $In_xGa_{1-x}N/GaN(1100)$ multiple quantum-wells grown on $\gamma$-$LiAlO_2(100)$ by plasma-assisted molecular-beam epitaxy", Physical Review B 67 (2003).

Takeuchi et al., "Theoretical Study of Orientation Dependence of Piezoelectric Effects in Wurtzite Strained GaInN/GaN Heterostructures and Quantum Wells", Jpn. J. Appl. Phys. vol. 39, pp. 413-416, Part 1, No. 2A (Feb. 2000).

Grandjean et al., "Self-limitation of AlGaN/GaN quantum well energy by built-in polarization field", Applied Physics Letters, vol. 74, No. 16 (Apr. 19, 1999).

Amano et la., "Stress and Defect Control in GaN Using Low Temperature Interlayers", Jpn. J. Appl. Phys., vol. 37 (1998).

Mukai et al., "Ultraviolet InGaN and GaN Single-Quantum-Well-Structure Light-Emitting Diodes Grown on Epitaxially Laterally Overgrown GaN Substrates", Jpn. J. Appl. Phys., vol. 38, pp. 5735-5739 (1999).

Miller et al., "Electric field dependence of optical absorption near the band gap of quantum-well structures", The American Physical Society, Physical Review B, vol. 32, No. 2 (Jul. 15, 1985).

Pearton et al., "GaN: Processing, defects, and devices", Applied Physics Reviews, Journal of Applied Physics, vol. 86, No. 1 (Jul. 1, 1999).

S. Nakamura and G. Fasol, The Blue Laser Diode, (Springer, Heidelberg, 1997), pp. 160-178.

Waltereit et al., "M-Plane GaN(1 1 0 0) Grown on $\gamma$-$LiAlO_2$(1 0 0): Nitride Semiconductors Free of Internal Electrostatic Fields," Journal of Crystal Growth 227-228 (2001), pp. 437-441.

Ajoul et al., "Hydrogen and Nitrogen Ambient Effects on Epitaxial Growth of GaN by Hydride Vapour Phase Epitaxy," Journal of Crystal Growth 230 (2001), pp. 372-376.

* cited by examiner

FABRICATION OF NONPOLAR INDIUM GALLIUM NITRIDE THIN FILMS, HETEROSTRUCTURES AND DEVICES BY METALORGANIC CHEMICAL VAPOR DEPOSITION

CROSS-REFERENCE TO RELATED APPLICATIONS

This application claims the benefit under 35 U.S.C. § 119(e) of the following co-pending and commonly-assigned U.S. patent application:

U.S. Provisional Patent Application Ser. No. 60/569,749, filed on May 10, 2004, by Arpan Chakraborty, Benjamin A. Haskell, Stacia Keller, James S. Speck, Steven P. DenBaars, Shuji Nakamura and Umesh K. Mishra, entitled "FABRICATION OF NONPOLAR InGaN THIN FILMS, HETEROSTRUCTURES AND DEVICES BY METALORGANIC CHEMICAL VAPOR DEPOSITION,";

which application is incorporated by reference herein.

This application is related to the following co-pending and commonly-assigned applications:

International Patent Application No. PCT/US03/21918, filed Jul. 15, 2003, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY", which application claims priority to U.S. Provisional Patent Application Ser. No. 60/433,843, filed Dec. 16, 2002, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY";

International Patent Application No. PCT/US03/21916, filed Jul. 15, 2003, by Benjamin A. Haskell, Paul T. Fini, Shigemasa Matsuda, Michael D. Craven, Steven P. DenBaars, James S. Speck, and Shuji Nakamura, entitled "GROWTH OF PLANAR, NON-POLAR A-PLANE GALLIUM NITRIDE BY HYDRIDE VAPOR PHASE EPITAXY", which application claims priority to U.S. Provisional Patent Application Ser. No. 60/433,844, filed Dec. 16, 2002, by Benjamin A. Haskell, Paul T. Fini, Shigemasa-Matsuda, Michael D. Craven, Steven P. DenBaars, James S. Speck, and Shuji Nakamura, entitled "TECHNIQUE FOR THE GROWTH OF PLANAR, NON-POLAR A-PLANE GALLIUM NITRIDE BY HYDRIDE VAPOR PHASE EPITAXY";

U.S. patent application Ser. No. 10/413,691, filed Apr. 15, 2003, by Michael D. Craven and James S. Speck, entitled "NON-POLAR A-PLANE GALLIUM NITRIDE THIN FILMS GROWN BY METALORGANIC CHEMICAL VAPOR DEPOSITION", which application claims priority to U.S. Provisional Patent Application Ser. No. 60/372,909, filed Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS";

U.S. patent application Ser. No. 10/413,690, filed Apr. 15, 2003, by Michael D. Craven, Stacia Keller, Steven P. DenBaars, Tal Margalith, James S. Speck, Shuji Nakamura, and Umesh K. Mishra, entitled "NON-POLAR (Al,B,In,Ga)N QUANTUM WELL AND HETEROSTRUCTURE MATERIALS AND DEVICES, which application claims priority to U.S. Provisional Patent Application Ser. No. 60/372,909, filed Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS";

U.S. patent application Ser. No. 10/413,913, filed Apr. 15, 2003, by Michael D. Craven, Stacia Keller, Steven P. DenBaars, Tal Margalith, James S. Speck, Shuji Nakamura, and Umesh K. Mishra, entitled "DISLOCATION REDUCTION IN NON-POLAR GALLIUM NITRIDE THIN FILMS", which application claims priority to U.S. Provisional Patent Application Ser. No. 60/372,909, filed Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS";

International Patent Application No. PCT/US03/39355, filed Dec. 11, 2003, by Michael D. Craven and Steven P. DenBaars, entitled "NONPOLAR (Al, B, In, Ga)N QUANTUM WELLS", which application is a continuation-in-part of the above Patent Application Nos. PCT/US03/21918 (30794.93-WO-U1), PCT/US03/21916 (30794.94-WO-U1), 10/413,691 (30794.100-US-U1), 10/413,690 (30794.101-US-U1), 10/413,913 (30794.102-US-U1);

U.S. Provisional Patent Application Ser. No. 60/576,685, filed on Jun. 3, 2004, by Benjamin A. Haskell, Melvin B. McLaurin, Steven P. DenBaars, James S. Speck, and Shuji Nakamura, entitled "GROWTH OF PLANAR REDUCED DISLOCATION DENSITY M-PLANE GALLIUM NITRIDE BY HYDRIDE VAPOR PHASE EPITAXY"; and U.S. Provisional Patent Application Ser. No. 60/660,283, filed on Mar. 10, 2005, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE";

all of which applications are incorporated by reference herein.

STATEMENT REGARDING SPONSORED RESEARCH AND DEVELOPMENT

The present invention was made under support from the University of California, Santa Barbara Solid State Lighting and Display Center member companies, including Stanley Electric Co., Ltd., Mitsubishi Chemical Corp., Rohm Co., Ltd., Cree, Inc., Matsushita Electric Works, Matsushita Electric Industrial Co., and Seoul Semiconductor Co., Ltd.

BACKGROUND OF THE INVENTION

1. Field of the Invention

This invention is related to compound semiconductor growth and device fabrication. More particularly the invention relates to the growth and fabrication of indium gallium nitride (InGaN) containing electronic and optoelectronic devices by metalorganic chemical vapor deposition (MOCVD).

2. Description of the Related Art (Note: This application references a number of different publications as indicated throughout the specification by reference numbers enclosed in brackets, e.g., [Ref. x]. A list of these different publications ordered according to these reference numbers can be found below in the section entitled "References." Each of these publications is incorporated by reference herein.).

The usefulness of gallium nitride (GaN) and its ternary and quaternary compounds incorporating aluminum and indium (AlGaN, InGaN, AlINGaN) has been well established for fabrication of visible and ultraviolet optoelectronic devices and high-power electronic devices. These devices are typically grown epitaxially by growth techniques including molecular beam epitaxy (MBE), metalorganic chemical vapor deposition (MOCVD), or hydride vapor phase epitaxy (HVPE).

GaN and its alloys are most stable in the hexagonal würtzite crystal structure, in which the structure is described by two (or three) equivalent basal plane axes that are rotated 120° with respect to each other (the a-axes), all of which are perpendicular to a unique c-axis. FIG. 1 is a schematic of a generic hexagonal würtzite crystal structure 100 and planes of interest 102, 104, 106, 108 with these axes 110, 112, 114, 116 identified therein, wherein the fill patterns are intended to illustrate the planes of interest 102, 104 and 106, but do not represent the materials of the structure 100. Group III and nitrogen atoms occupy alternating c-planes along the crystal's c-axis. The symmetry elements included in the würtzite structure dictate that III-nitrides possess a bulk spontaneous polarization along this c-axis. Furthermore, as the würtzite crystal structure is non-centrosymmetric, würtzite nitrides can and do additionally exhibit piezoelectric polarization, also along the crystal's c-axis. Current nitride technology for electronic and optoelectronic devices employs nitride films grown along the polar c-direction. However, conventional c-plane quantum well structures in III-nitride based optoelectronic and electronic devices suffer from the undesirable quantum-confined Stark effect (QCSE), due to the existence of strong piezoelectric and spontaneous polarizations. The strong built-in electric fields along the c-direction cause spatial separation of electron and holes that in turn give rise to restricted carrier recombination efficiency, reduced oscillator strength, and red-shifted emission.

(Al,Ga,In)N quantum-well structures employing nonpolar growth directions, e.g., the <11$\bar{2}$0> a-direction or <1$\bar{1}$00> m-direction, provide an effective means of eliminating polarization-induced electric field effects in würtzite nitride structures since the polar axis lies within the growth plane of the film, and thus parallel to heterointerfaces of quantum wells. In the last few years, growth of nonpolar (Al,Ga,In)N has attracted great interest for its potential use in the fabrication of nonpolar electronic and optoelectronic devices. Recently, nonpolar m-plane AlGaN/GaN quantum wells grown on lithium aluminate substrates via plasma-assisted MBE and nonpolar a-plane AlGaN/GaN multi-quantum wells (MQWs) grown by both MBE and MOCVD on r-plane sapphire substrates showed the absence of polarization fields along the growth direction. Thus, nonpolar III-nitride light emitting diodes (LEDs) and laser diodes (LDs) have the potential to perform significantly better compared to their polar counterpart.

Unfortunately, nonpolar InGaN growth has proven challenging. Indeed, the literature contains only two reports of the successful growth of nonpolar InGaN: Sun, et al. [Ref. 1], grew m-plane InGaN/GaN quantum well structures containing up to 10% In by MBE, and Chitnis, et al. [Ref. 2], grew a-plane InGaN/GaN quantum well structures by MOCVD. Sun, et al's, paper [Ref. 1] focused primarily on structural and photoluminescence characteristics of their material, and does not suggest that their InGaN film quality is sufficient to fabricate working devices. Chitnis, et al's paper [Ref. 1] described a nonpolar GaN/InGaN light emitting diode structure. However, the limited data given in the paper suggested their nonpolar InGaN material quality was extremely poor. Indeed, their device displayed large shifts in emission intensity with varying injection current, poor diode current-voltage characteristics, and extreme detrimental heating effects that necessitated pulsing the current injection in order to test the device. These poor characteristics most likely can be explained by deficient material quality.

The lack of successful nonpolar InGaN growth can be attributed to several factors. First, the large lattice mismatches between InGaN and available substrates severely complicate InGaN heteroepitaxy. Second, InGaN must generally be grown at comparatively lower temperatures than GaN due to the propensity for In to desorb from the growth surface at higher temperatures. Unfortunately, nonpolar nitrides are typically grown above 900° C. and more often above 1050° C., temperatures at which In readily desorbs from the surface. Third, high-quality nonpolar nitrides are typically grown at decreased pressures (<100 Torr) in order to stabilize the a- and m-planes relative to inclined facets. However, it has been previously widely reported that c-plane InGaN should be grown at atmospheric pressure in order to enhance In incorporation and decrease carbon incorporation.

The present invention overcomes these challenges and for the first time yields high quality InGaN films and InGaN-containing devices by MOCVD.

SUMMARY OF THE INVENTION

To overcome the limitations in the prior art described above, and to overcome other limitations that will become apparent upon reading and understanding the present specification, the present invention describes a method for fabricating high-quality indium (In) containing epitaxial layers and heterostructures and devices, including planar nonpolar InGaN films. The method uses MOCVD to realize nonpolar InGaN/GaN violet and near-ultraviolet light emitting diodes and laser diodes.

BRIEF DESCRIPTION OF THE DRAWINGS

Referring now to the drawings in which like reference numbers represent corresponding parts throughout.

DETAILED DESCRIPTION OF THE INVENTION

Figure 1:
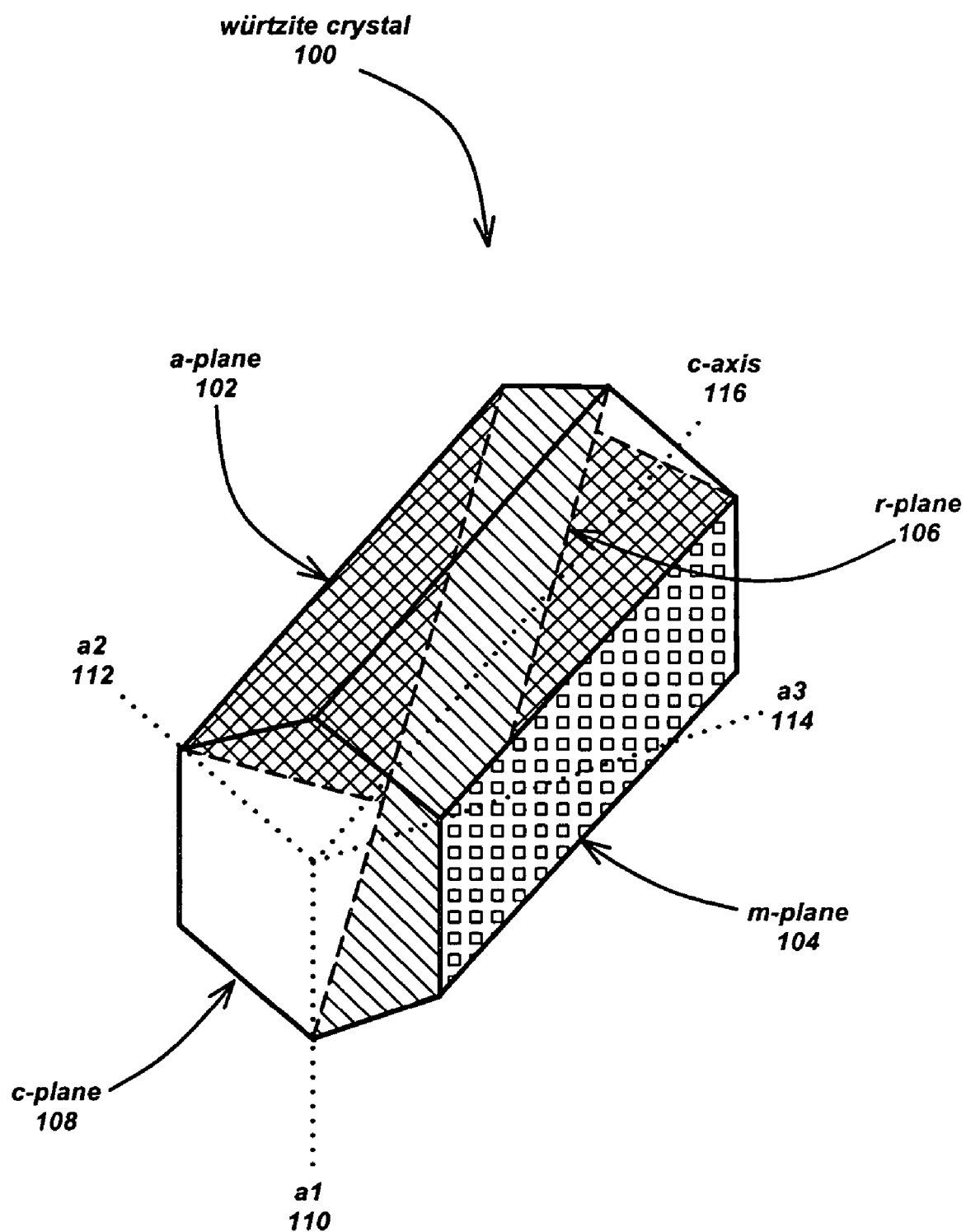
FIG. 1 illustrates a hexagonal würtzite crystal structure with its axes identified.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

Growth of nonpolar nitride semiconductors offers a means of eliminating polarization effects in würtzite-structure III: nitride devices. Current (Ga,Al,In,B)N devices are grown in the polar [0001] c-direction, which results in charge separation across heterostructures. The resulting polarization fields are detrimental to the performance of current state of the art devices, particularly for optoelectronic devices. Growth of such devices along a nonpolar direction could significantly improve device performance.

Until now, no means existed for growing high-quality group-III nitrides or group-III-nitride-based heterostructures containing InGaN along nonpolar directions. The present invention now allows the fabrication of nonpolar InGaN films as well as nonpolar InGaN-containing device structures. Previous problems related to gross surface roughening, low In incorporation, and In desorption in InGaN heterostructures have been overcome by this technique. This MOCVD-based invention has been applied to the realization of the first nonpolar InGaN/GaN violet LEDs. This invention enables the production of nonpolar GaN-based visible and near-ultraviolet LEDs and LDs for the first time.

Technical Description

The present invention is an approach for fabrication of high-quality In-containing epitaxial layers and heterostructures and devices containing the same. Superior planar nonpolar InGaN films have been grown by MOCVD, and functional nonpolar InGaN-containing devices have been fabricated by the same technique. Although this particular demonstration involves the fabrication of a-plane oriented InGaN-based quantum wells, research on m-plane nitride growth has indicated that the techniques described herein are broadly applicable to the growth of m-plane InGaN/GaN devices as well.

Planar nonpolar a-plane GaN templates were grown by MOCVD. The details of the template growth are disclosed in co-pending and commonly-assigned patent application Ser. Nos. 10/413,691 (30794.100-US-U1) and PCT/US03/21916 (30794.94-WO-U1), which are set forth above and incorporated by reference herein. These a-plane GaN templates provide a nearly lattice-matched layer on which the nonpolar InGaN films could be re-grown.

The MOCVD growths were carried out in a high-temperature vertical reactor with high-speed rotation. A rotation speed of 300 rpm was employed. The precursors used for Ga, In, Mg and Si sources were trimethylgalium (TMG), trimethylindium (TMI), bis-cyclopentadienyl magnesium (Cp$_2$Mg) and disilane, respectively. High-purity ammonia was used as the nitrogen source. The a-plane GaN template on r-plane sapphire substrate is grown by a two-step process which includes a low temperature (620–650° C.) GaN nucleation layer step and a high temperature (1130–1180° C.) GaN growth step. A V/III ratio between 650 and 670 is used. The GaN growth rate, measured by in-situ thickness measurement using reflectance spectroscopy, is in the range 4–6 Å/s. A total flow of 10 slpm is employed during the UID GaN growth.

The above growth procedure established the feasibility of growing nonpolar InGaN. The present invention is directed to the growth and fabrication of a nonpolar InGaN-based LED.

Figure 2:
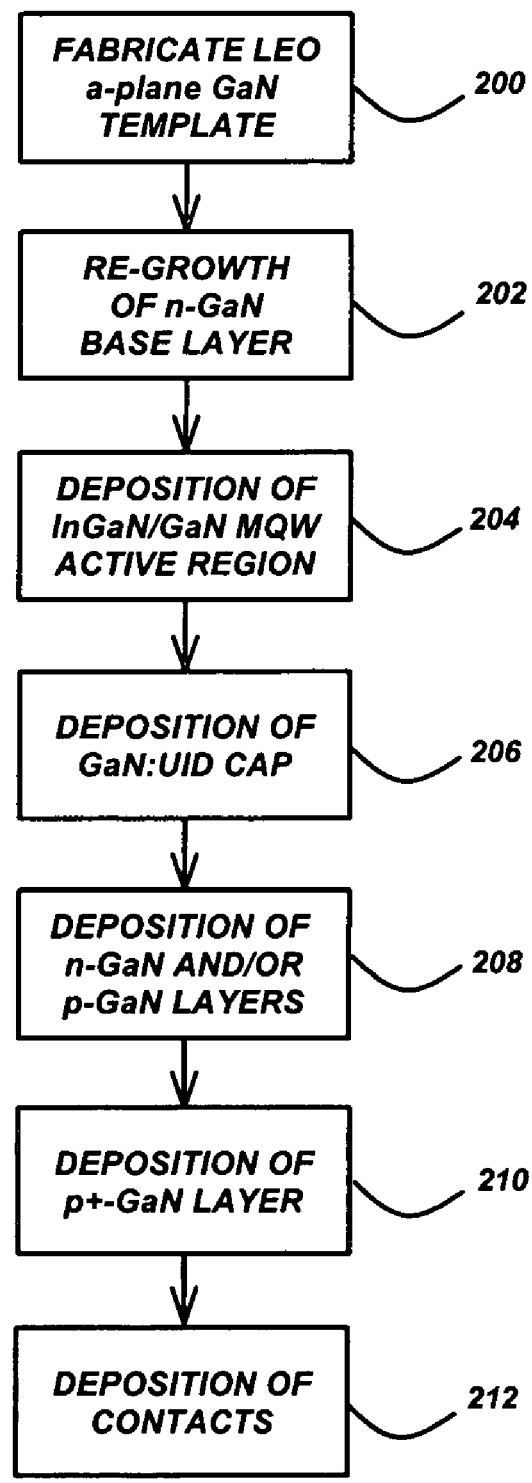
FIG. 2 is a flowchart describing the process steps according to the preferred embodiment of the present invention.
Figure 3:
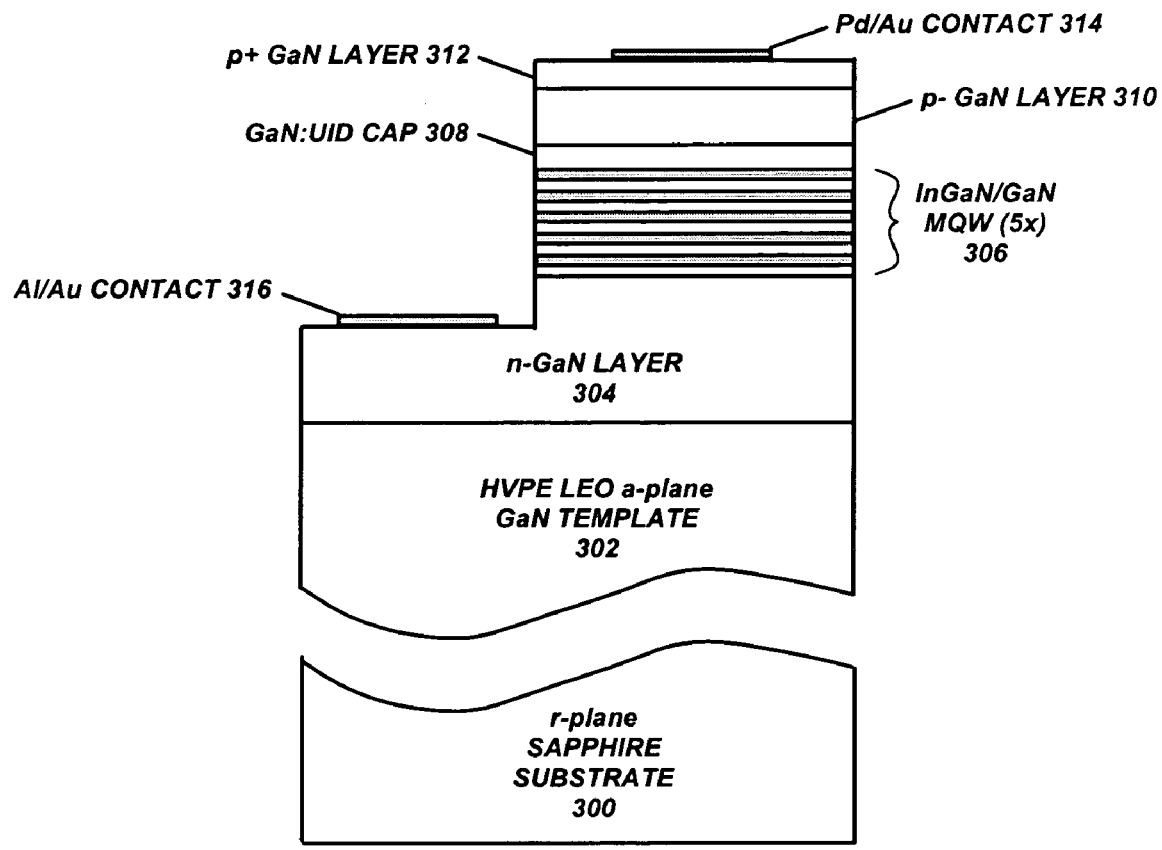
FIG. 3 is a schematic cross-section of the nonpolar light emitting diode.

FIG. 2 is a flowchart describing the process steps according to the preferred embodiment of the present invention, while FIG. 3 is a schematic cross-section of the nonpolar light emitting diode fabricated according to the preferred embodiment of the present invention.

Block 200 represents providing a smooth, low-defect-density III-nitride substrate or template. For example, this Block may represent the fabrication, on an r-plane sapphire substrate 300, of a 10 μm-thick reduced-dislocation-density lateral epitaxial overgrown (LEO) a-plane GaN template 302 by HVPE. The details of the HVPE-based LEO process are disclosed in co-pending and commonly-assigned Patent Application No. PCT/US03/21918 (30794.93-WO-U1), which is set forth above and incorporated by reference herein.

Although the template 300 is GaN, it could also comprise aluminum nitride (AlN) or aluminum gallium nitride (AlGaN). Moreover, although an a-plane oriented GaN template 300 is described, m-plane GaN templates could be fabricated as well.

The mask for the LEO process comprises parallel 8 μm wide SiO$_2$ stripes separated by 2 μm wide window openings oriented parallel to the GaN <1$\bar{1}$00> direction. The ratio of lateral growth rates of the Ga-face and N-face {0001} wings was ~6:1, resulting in approximately 6.5 μm wide defect-free overgrown areas between the windows and coalescence fronts. Transmission electron microscopy (TEM) of comparable samples has shown the threading dislocation and basal plane stacking fault densities in the overgrown regions to be below ~5×10$^6$ cm$^{-2}$ and 3×10$^3$ cm$^{-1}$, respectively.

Block 202 represents the re-growth, carried out in a vertical MOCVD reactor, which begins with a 2.2 μm Si doped n-GaN base layer 304 with an electron concentration of 2×10$^{18}$ cm$^{-3}$. This layer is deposited under typical a-plane GaN growth conditions (e.g., substrate temperature 1050–1150° C., system pressure 40–100 Torr, H$_2$ carrier gas, V/III ~100). The result is a substrate that comprises a planar nonpolar a-plane GaN template grown by MOCVD.

Alternatively, a smooth, low-defect-density III-nitride substrate may be provided. Such substrates may include a low-defect-density free-standing a-plane GaN wafer, a low-defect-density free-standing m-plane GaN wafer, a low-defect-density free-standing a-plane AlN wafer, a low-defect-density free-standing m-plane AlN wafer, a low-defect-density bulk a-plane GaN wafer, a low-defect-density bulk m-plane GaN wafer, a low-defect-density bulk a-plane AlN wafer, or a low-defect-density bulk m-plane AlN wafer.

It is also possible to grow alloy substrates, such as AlGaN, by a variety of methods, particularly hydride vapor phase epitaxy (HVPE). The substrate used for practicing this invention could be any nonpolar AlGaN or other III-nitride substrate.

Block 204 represents the deposition of an InGaN/GaN active region 306 for the device at a reduced temperature, at atmospheric pressure, using N$_2$ carrier gas. This Block includes: (1) growing nonpolar InGaN layers on the substrate or template at a reduced temperature (near or at approximately 900° C.) using an N$_2$ carrier gas to enhance In incorporation and decrease In desorption, wherein the InGaN layers are grown near or at atmospheric pressure (near or at approximately 760 Torr) to enhance InGaN film quality and decrease carbon incorporation, (2) growing a thin low-temperature GaN capping layer on the nonpolar InGaN layers to prevent In desorption during the later growth of a p-type GaN layer, and (3) growing one or more InGaN/GaN multiple quantum wells (MQWs) near or at atmospheric pressure (near or at approximately 600–850 Torr) on the GaN capping layer.

The use of N$_2$ carrier gas is critical for higher In incorporation in the InGaN films. The comparatively low growth temperature enhances In incorporation and decreases the In desorption rate from the growth surface. Additionally, the use of atmospheric pressure enhances the InGaN film quality and decreases the carbon incorporation in the film, reducing the concentration of non-radiative point defects in the active region.

Preferably, the active region 306 is comprised of a 5 period MQW stack with 16 nm Si-doped GaN barriers and 4 nm $In_{0.17}Ga_{0.83}N$ quantum wells. A relatively high growth rate of 0.4 Å/s is used in this step to ensure smooth InGaN/GaN heterointerfaces and thus improve the optical performance of the device.

Block 206 represents growing an undoped GaN barrier 308 near or at atmospheric pressure on the InGaN/GaN MQW structure 306. Specifically, this Block represents the deposition of a 16 nm undoped (or unintentionally doped (UID)) GaN barrier 308 at low temperature to cap the InGaN MQW structure 306 in order to prevent desorption of InGaN from the active region 306 later in the growth.

Block 208 represents growing one or more n-type and p-type (Al,Ga)N layers 310 at low pressure (near or at approximately 20–150 Torr) on the undoped GaN barrier 308. Specifically, this Block represents the deposition of a 0.3 μm Mg-doped p-type GaN layer 310 with a hole concentration of $6\times10^{17}$ $cm^{-3}$ at a higher temperature (~1100° C.) and lower pressure (~70 Torr), wherein a total flow of 16 slpm is employed for the p-type GaN growth.

Block 210 represents the deposition of a 40 nm heavily doped $p^+$-GaN layer 312. This layer 312 acts as a cap for the structure.

Finally, Block 212 represents the deposition of a Pd/Au contact 314 and an Al/Au contact 316, as p-GaN and n-GaN contacts respectively, for the device.

The end result of these process steps is a nonpolar InGaN based heterostructure and device. Specifically, the end result of these process steps is an InGaN LED or LD.

Experimental Results

Figure 4:
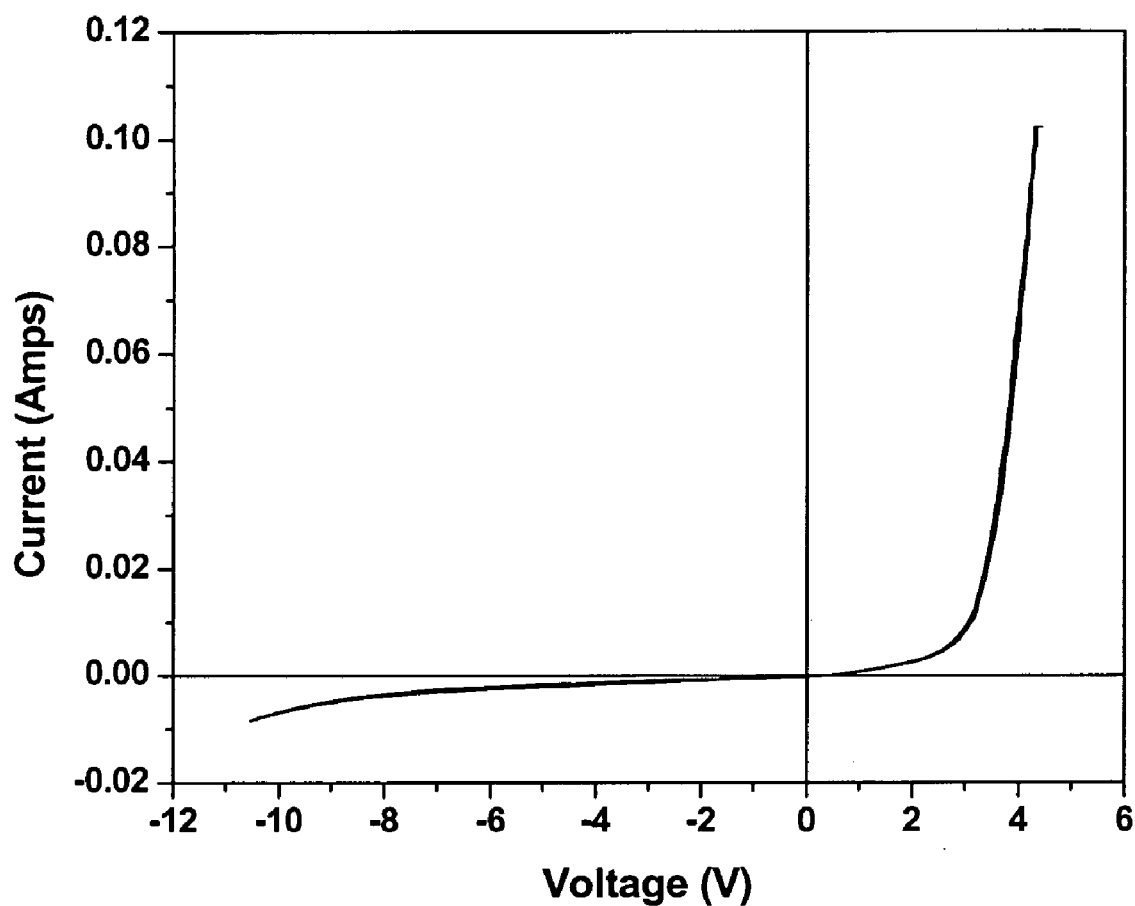
FIG. 4 is a graph of the current-voltage (I-V) characteristic of the nonpolar LED.
Figure 5:
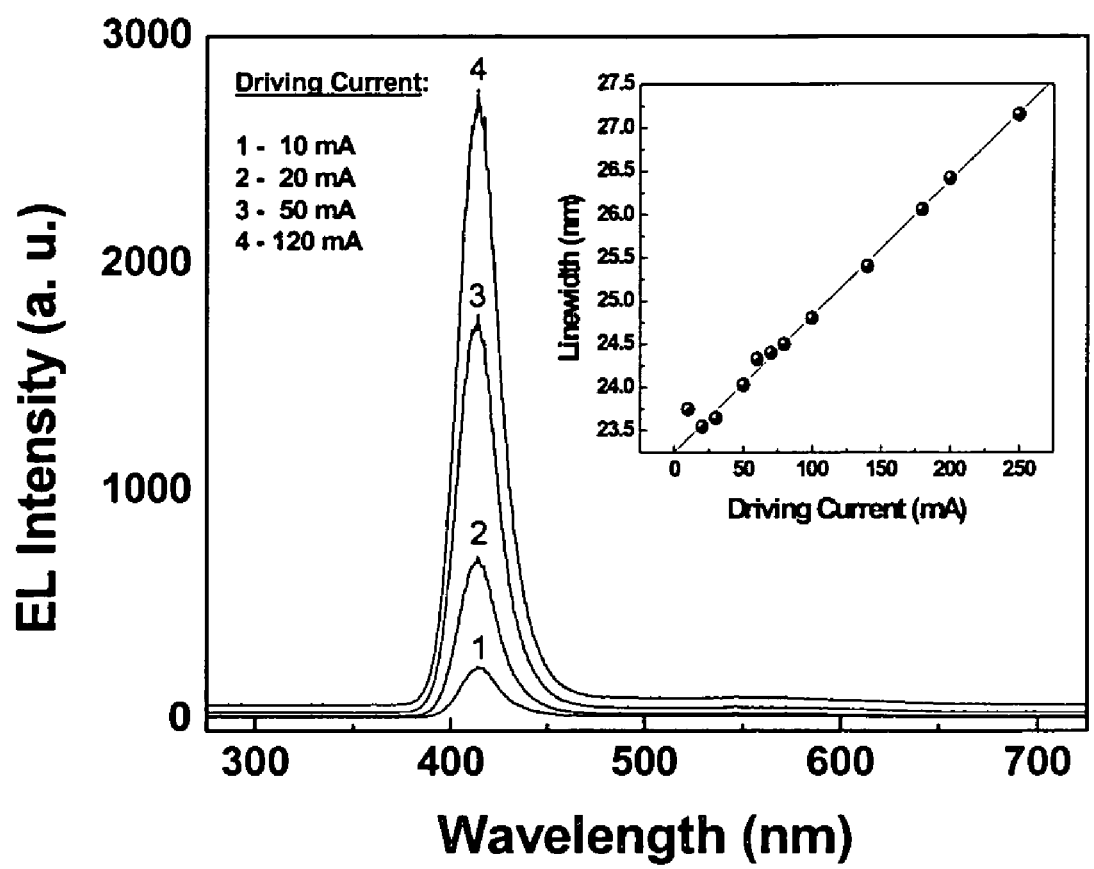
FIG. 5 is a graph of the electroluminescence (EL) spectra for different driving currents, wherein the inset shows the EL linewidth as a function of the driving current.
Figure 6:
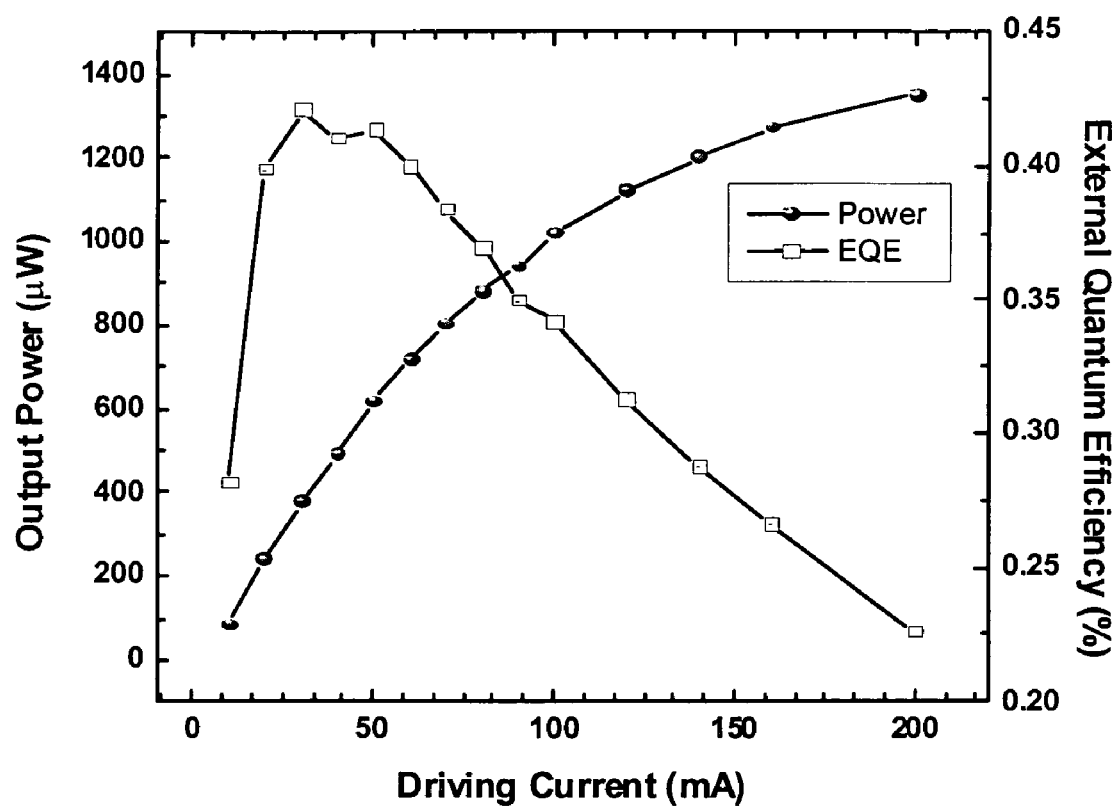
FIG. 6 is a graph of the on-wafer output power and external-quantum efficiency (EQE) of the LED as a function of the drive current.

As-grown samples were investigated by optical microscopy and photoluminescence (PL) measurement. 300×300 μm² diode mesas were defined by chlorine-based reactive ion etching (RIE). Pd/Au (3/200 nm) and Al/Au (30/200 nm) were used asp-GaN and n-GaN contacts respectively. The electrical and luminescence characteristics of the diode were measured by on-wafer probing of the devices. The I-V measurements, which are shown in FIG. 4, were performed with a Hewlett-Packard 4145B semiconductor parameter analyzer. Relative optical power measurements under direct current (DC) conditions were obtained from the backside emission through the sapphire substrate onto a calibrated broad area Si photodiode. The emission spectrum and the optical power emission of the LEDs were measured as a function of driving currents, as shown in FIGS. 5 and 6, respectively. All measurements were carried out at room temperature.

The device structure described above constitutes the first report of a functioning InGaN-based LED. The I-V curve (FIG. 4) of the diode exhibited a forward voltage of 3.3 V with a low series resistance of 7.8 Ω. Nonpolar a-plane GaN p-n junction diodes grown under identical conditions on planar a-plane GaN templates exhibited similar forward voltage but had higher series resistances on the order of 30 Ω. The lower series resistance in these LEDs can be attributed to the higher conductivity in the defect free overgrown region of the LEO GaN template.

The electroluminescence (EL) spectra of the devices were studied as a function of the dc driving current. Emission spectra were measured at drive currents ranging from 10 to 250 mA. The devices emitted in the violet spectral range at 413.5 nm for all drive currents with minimal linewidth broadening (FIG. 5). The PL spectra on the as-grown sample showed a strong quantum-well emission at 412 nm with a narrow linewidth of 25 nm. The absence of blue-shift in the emission peak with increasing drive currents is in contrast to the commonly observed phenomenon of blue shift in c-plane LEDs working at this wavelength range and similar drive current range. The linewidth increased almost linearly with the driving current starting from a minimum of 23.5 nm at 20 mA to 27.5 nm at 250 mA. This minimal linewidth broadening with the increase in drive current suggests that the device heating was low in this current regime.

The dependence of the output power on the dc drive current was then measured. The output power increased sublinearly as the drive current was increased from 10 mA until it saturated at a current level close to 200 mA. The saturation of the output power can be attributed to heating effects, thereby causing a reduction in the quantum efficiency. The output power at 20 mA forward current was 240 μW, corresponding to an external quantum efficiency (EQE) of 0.4%. DC power as high as 1.5 mW was measured for a drive current of 200 mA. The EQE increased as the drive current was increased, attaining a maximum of 0.42% at 30 mA, and then decreased rapidly as the forward current was increased beyond 30 mA. The low EQE for these LEDs can be attributed partially to the poor reflectivity of the p-contact and partially to the "dark" defective window regions of the LEO which do not emit light. It should be noted that the device structure described above constitutes a proof-of-concept, non-optimized device. It is anticipated that significant improvement in EQE can be made by optimization of all aspects of the template/base layers and LED structure.

Key Features

The Technical Description of the nonpolar LED structure described above includes several key features relevant to the growth and fabrication of a broad range of nonpolar InGaN-based heterostructures and devices. These key features include:

1. Use of a smooth, low-defect-density GaN substrate or template, such as, but not limited to, an HVPE LEO a-plane or m-plane GaN template.
2. Growth of nonpolar InGaN at a reduced temperature (below ~900° C.) using $N_2$ carrier gas to enhance In incorporation and decrease In desorption.
3. Growth of the InGaN layers at or near atmospheric pressure (760 Torr) to enhance InGaN film quality and decrease carbon incorporation.
4. Use of a thin low-temperature GaN capping layer to prevent In desorption during the p-GaN deposition.
5. Growth of the InGaN/GaN MQW and the undoped GaN barrier near or at atmospheric pressure (~600–850 Torr), whereas growth of the n-type and p-type GaN occurs at low pressure (40–80 Torr).

Possible Modifications and Variations of the Embodiments

The preferred embodiment has described a process by which planar, high quality InGaN films and heterostructures may be grown along nonpolar directions. The specific example described in the Technical Description section above was for an a-plane GaN device (i.e. the growth direction was the GaN <11$\bar{2}$0> direction). However, research has established that growth procedures for a-plane nitrides are typically compatible with or easily adaptable to m-plane nitride growth. Therefore, this process is applicable to films and structures grown along either the würtzite <11$\bar{2}$0> or <1$\bar{1}$00> directions.

The base layer for the InGaN film described above was an MOCVD-grown a-plane GaN template grown on r-plane $Al_2O_3$. Similarly, the device structure described in the Key Features section utilized a HVPE-grown LEO a-plane GaN layer grown on r-plane $Al_2O_3$. Alternative substrates can be used in the practice of this invention without substantially altering its essence. For example, the base layer for either process could comprise an a-plane GaN film grown by MBE, MOCVD, or HVPE on an a-plane SiC substrate. Other possible substrate choices include, but are not limited to, a-plane 6H—SiC, m-plane 6H—SiC, a-plane 4H—SiC, m-plane 4H—SiC, other SiC polytypes and orientations that yield nonpolar GaN, a-plane ZnO, m-plane ZnO, (100) $LiAlO_2$, (100) $MgAl_2O_4$, free-standing a-plane GaN, free-standing AlGaN, free-standing AlN or miscut variants of any of these substrates. These substrates do not necessarily require a GaN template layer be grown on them prior to nonpolar InGaN device growth. A GaN, AlN, AlGaN, AlInGaN, AlInN, etc., base layer, with or without the incorporation of suitable in situ defect reduction techniques, can be deposited at the beginning of the device growth process. In general though, the film quality and device performance will be enhanced through the use of a reduced defect-density (i.e., fewer than $1\times10^9$ dislocations/cm$^2$ and $1\times10^4$ stacking faults/cm$^{-1}$) nitride template/base layer. The lateral epitaxial overgrowth process used in this invention achieves defect densities below these levels.

The preferred embodiment describes an LED structure that contains specifically InGaN and GaN layers. However, the present invention is also compatible with the incorporation of aluminum (Al) in any or all of the layers. Generally speaking, any of the layers grown according to the present invention may have compositions described by the formula $(Al_xIn_yGa_z)N$ where $0 \leq x \leq 1$, $0 \leq y \leq 1$, $0 \leq z \leq 1$, and $x+y+z=1$. Any or all layers may optionally contain additional dopants, including, but not limited to, Zn, Mg, Fe, Si, O, etc., and still remain within the scope of this invention.

The capping layer and barrier layers in the device described above are comprised of GaN. However, each of these layers may optionally comprise any nonpolar AlInGaN composition that provides suitable carrier confinement, or in the case of the capping layer, suitable In desorption resistance.

The thicknesses of the GaN and InGaN layers in the device structure described above may be substantially varied without fundamentally deviating from the preferred embodiment of the invention. Similarly, the layer compositions may be altered to include aluminum and/or boron to alter the electronic band structure. Doping profiles may be altered as well to tailor the electrical and optical properties of the structure. Additional layers may be inserted in the structure or layers may be removed, or the number of quantum wells in the structure may be varied within the scope of this invention. For example, reducing the thickness of the UID GaN capping layer and including an Mg-doped p-type AlGaN electron blocking layer could significantly enhance LED device performance.

The precise growth conditions described in the Technical Description section above may be expanded as well. Acceptable growth conditions vary from reactor to reactor depending on the geometry of configuration of the reactor. The use of alternative reactor designs is compatible with this invention with the understanding that different temperature, pressure ranges, precursor/reactant selection, V/III ratio, carrier gases, and flow conditions may be used in the practice of this invention.

As noted above, the device described herein comprises an LED. However, the present invention is applicable to the general growth of nonpolar InGaN films and structures containing InGaN and should not be considered limited to LED structures. The present invention offers significant benefits in the design and fabrication of a range of devices, including, but not limited, to nonpolar nitride-based LEDs having wavelengths between 360 and 600 nm and nonpolar nitride-based laser diodes operating in a similar wavelength range. Nonpolar strained single quantum well laser diodes could be fabricated using this invention having lower transparent carrier densities than are required for conventional c-plane InGaN-based laser diodes. Nonpolar InGaN-based laser diodes fabricated with this invention will also benefit from reduced hole effective masses related to anisotropic strain-induced splitting of the heavy and light hole bands. The lower effective hole mass, which cannot normally be achieved in c-plane III:nitride devices, will result in reduced threshold current densities for lasing compared to c-plane laser diodes. Lower hole effective mass results in higher hole mobility and thus non-polar p-type GaN have better electrical conductivity. Electronic devices will also benefit from this invention. The advantage of higher mobility in nonpolar p-GaN can be employed in the fabrication of bipolar electronic devices like heterostructure bi-polar transistors, etc. The higher p-type conductivity in non-polar nitrides also results in lower series resistances in p–n junction diodes and LEDs. Nonpolar InGaN channel MODFETs, with reduced radio-frequency (RF) dispersion can now be fabricated that will feature excellent high-frequency performance because of the high saturation electron velocity in InGaN.

Advantages and Improvements over Existing Practice, and the Features Believed to Be New Many of the novel features of this invention have been detailed in the Background and Technical Description sections of this disclosure. The key points identified in the Key Features section constitute the most critical and novel elements in the growth of nonpolar InGaN. This invention enables for the first time the fabrication of high-quality nonpolar InGaN-containing electronic and optoelectronic devices by allowing the growth of smooth, pit-free InGaN layers in heterostructures.

Chitnis, et al's recent disclosure [Ref. 2] of their InGaN/GaN LED grown by MOCVD provides the closest comparison to this invention. The key improvements in this invention as compared to Chitnis are:

1. Use of a high-quality, low-defect density substrate/template/base layer. Their direct growth method involves deposition of an a-plane GaN template layer on an r-plane sapphire substrate. However, their process includes no effective means of reducing the threading dislocation or stacking fault densities below ~$10^9$ cm$^{-2}$ and ~$10^5$ cm$^{-1}$, respectively. These structural defects propagate into their InGaN layers, likely causing deterioration in InGaN layer morphology, layer structural quality, and device performance. This invention utilizes defect reduction techniques in the template layer to improve material quality and device performance.

2. Use of atmospheric pressure or near atmospheric pressure growth conditions for the InGaN/GaN quantum well and GaN capping layer growth. This atmospheric pressure step enhances indium incorporation and decreases carbon contamination in the quantum wells, improving device performance compared to their results.

3. Inclusion of a GaN capping layer grown at reduced temperature, atmospheric pressure, and using nitrogen as the carrier gas. Their device structure contains no low temperature capping layer. Their quantum wells likely degraded as they increased their growth temperature to grow their p-AlGaN layer directly above their quantum well region. The inclusion of the type of capping layer described herein protects the quantum well region and improved device quality.

Any one of these improvements would offer significant benefit in the fabrication of InGaN-based electronic and optoelectronic devices compared to the prior art. The combination of these three key elements has resulted in far superior InGaN layer quality and device performance and represent a significant improvement of the state of the art in nonpolar III-nitride device growth.

REFERENCES

The following references are incorporated by reference herein:

1. Y. Sun, et al., "Nonpolar $In_xGa_{1-1}$/GaN (1$\bar{1}$00) multiple quantum wells grown on γ-$LiAlO_2$ (100) by plasma assisted molecular beam epitaxy," Phys Rev. B, 67, 41306 (2003). This article provides the only other report of nonpolar InGaN growth in the literature, in this case performed by MBE.

2. Chitnis, et al., "Visible light-emitting diodes using a-plane GaN—InGaN multiple quantum wells over r-plane sapphire," Appl. Phys. Lett., 84, 3663 (2004).

3. S. J. Pearton, et al., "GaN: Processing, defects, and devices," J. Appl. Phys., 86, 1 (1999). This review provides an overview of c-plane GaN technology.

4. T. Takeuchi, et al., "Quantum-Confined Stark Effect due to Piezoelectric Fields in GaInN Strained Quantum Wells," Jpn. J. Appl. Phys. Part 2, 36, L382 (1997). This article quantifies the magnitude of the detrimental electric fields in polar c-plane InGaN devices. This field is eliminated in nonpolar devices fabricated according to this invention.

5. D. Miller, at al., "Electric field dependence of optical absorption near the band gap of quantum-well structures," Phys. Rev. B, 32, 1043 (1985). This paper discusses the effects of electric fields and the QCSE on optoelectronic devices.

6. F. Bernardini, et al., "Spontaneous polarization and piezoelectric constants of III–V nitrides," Phys. Rev. B, 56, R10024 (1997). This paper gives calculations of the substantial piezoelectric coefficients in nitride semiconductors.

7. J. S. Im, et al., "Reduction of oscillator strength due to piezoelectric fields in $GaN/Al_xGa_{1-x}N$ quantum wells," Phys. Rev. B, 57, R9435 (1998). This article establishes the reduced efficiency of polar c-plane GaN-based devices due to polarization effects. By extension, nonpolar devices such as the ones described in this invention would be free of these effects and could achieve higher theoretical efficiency.

8. M. D. Craven, et al., "Structural characterization of nonpolar (11$\bar{2}$0) a-plane GaN thin films grown on (1$\bar{1}$02) r-plane sapphire," Appl. Phys. Lett., 81, 469 (2002). This article constitutes the first public disclosure of nonpolar GaN MOCVD growth at UCSB.

9. P. Waltereit, et al, "Nitride semiconductors free of electrostatic fields for efficient white light-emitting diodes," Nature (London) 406, 865 (2000). This article was the first public demonstration of the elimination of polarization fields in m-plane GaN grown on $LiAlO_2$.

10. H. M. Ng, "Molecular-beam epitaxy of $GaN/Al_xGa_{1-x}N$ multiple quantum wells on R-plane (10$\bar{1}$2) sapphire substrates," Appl. Phys. Lett. 80, 4369 (2002). This paper represents one of the few reports of nonpolar AlGaN/GaN quantum heterostructures grown by MBE.

11. M. D. Craven, et al., "Characterization of a-plane GaN/(Al,Ga)N Multiple Quantum Wells Grown via Metalorganic Chemical Vapor Deposition," Jpn. J. Appl. Phys. Part 2, 42, L235 (2003). This paper is the first to describe the structural properties of MOCVD-grown AlGaN/GaN quantum heterostructures.

12. B. A. Haskell, et al., "Defect reduction in (11$\bar{2}$0) a-plane gallium nitride via lateral epitaxial overgrowth by hydride vapor phase epitaxy," Appl. Phys. Lett., 83, 644 (2003). This paper describes the HVPE LEO process used to produce the templates for the devices described in this invention.

13. T. Mukai and S. Nakamura, "Ultraviolet InGaN and GaN Single-Quantum-Well-Structure Light-Emitting Diodes Grown on Epitaxially Laterally Overgrown GaN Substrates," Jpn. J. Appl. Phys., Part 1, 38, 5735 (1999). This paper describes the fabrication of ultraviolet LEDs using InGaN/GaN active regions on LEO substrates.

14. S. Nakamura and G. Fasol, The Blue Laser Diode, (Springer, Heidelberg, 1997). This book provides an overview of c-plane GaN optoelectronics technology.

15. L. Coldren and S. Corzine, Diode Lasers and Photonic Integrated Circuits, (Wiley Interscience, 1995). Pages 160–178 and Appendix 11 provide theory relevant to the design of strained quantum well lasers. This book focused on arsenide- and phosphide-based optoelectronic devices, but the same theory should hold true for nonpolar InGaN-based strained single quantum well lasers designed using this invention.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating nonpolar indium gallium nitride (InGaN) based heterostructures and devices, comprising:
   (a) providing a smooth, low-defect-density III-nitride substrate or template;
   (b) growing one or more nonpolar InGaN layers on the substrate or template;
   (c) growing a thin low-temperature nitride capping layer on the nonpolar InGaN layers to prevent In desorption during growth of subsequent layers; and
   (d) growing one or more nonpolar n-type and p-type (Al,Ga)N layers at low pressure on the capping layer.

2. The method of claim 1, wherein the InGaN layers are grown at or near atmospheric pressure.

3. The method of claim 1, wherein the InGaN layers form one or more quantum well heterostructures.

4. The method of claim 1, wherein one or more undoped nonpolar GaN barrier layers are grown upon the InGaN layers.

5. The method of claim 4, wherein the undoped nonpolar GaN barrier layers are grown at or near atmospheric pressure.

6. The method of claim 1, wherein the capping layer is comprised of GaN.

7. A device fabricated using the method of claim 1.

8. A method of fabricating nonpolar indium gallium nitride (InGaN) based heterostructures and devices, comprising:
(a) providing a smooth, low-defect-density III-nitride substrate or template;
(b) growing nonpolar InGaN layers on the substrate or template;
(c) growing a thin low-temperature gallium nitride (GaN) capping layer on the nonpolar InGaN layers to prevent In desorption during growth of a p-type GaN layer;
(d) growing one or more InGaN/GaN multiple quantum wells (MQWs) near or at atmospheric pressure on the GaN capping layer;
(e) growing an undoped GaN barrier near or at atmospheric pressure on the InGaN/GaN MQWs; and
(f) growing one or more n-type and p-type (Al,Ga)N layers at low pressure on the undoped GaN barrier.

9. The method of claim 8, wherein the smooth, low-defect-density III-nitride substrate or template is a GaN, aluminum nitride (AlN) or aluminum gallium nitride (AlGaN) substrate.

10. The method of claim 8, wherein the substrate comprises a low-defect-density free-standing a-plane GaN wafer, a low-defect-density free-standing m-plane GaN wafer, a low-defect-density free-standing a-plane AlN wafer, a low-defect-density free-standing m-plane AlN wafer, a low-defect-density bulk a-plane GaN wafer, a low-defect-density bulk m-plane GaN wafer, a low-defect-density bulk a-plane AlN wafer, or a low-defect-density bulk m-plane AlN wafer.

11. The method of claim 8, wherein the template is grown by hydride vapor phase epitaxy (HVPE).

12. The method of claim 11, wherein the template comprises a low-defect-density hydride vapor phase epitaxy (HVPE) lateral epitaxial overgrown (LEO) a-plane or m-plane GaN template.

13. The method of claim 8, wherein the template comprises a planar nonpolar a-plane GaN template grown by metalorganic chemical vapor deposition (MOCVD).

14. The method of claim 13, wherein the a-plane GaN template is grown on an r-plane sapphire substrate by a two-step process that includes a low temperature GaN nucleation layer step and a high temperature GaN growth step.

15. The method of claim 8, wherein the growing step (b) comprises growing nonpolar InGaN layers on the substrate or template at a reduced temperature below approximately 900° C.

16. The method of claim 8, wherein the growing step (b) further comprises using an $N_2$ carrier gas to enhance indium (In) incorporation and decrease In desorption in the nonpolar InGaN layers.

17. The method of claim 8, wherein the growing step (b) comprises growing nonpolar InGaN layers on the substrate or template near or at approximately atmospheric pressure to enhance InGaN film quality and decrease carbon incorporation.

18. The method of claim 8, wherein the InGaN/GaN MQWs are grown near or at approximately 600–850 Torr.

19. The method of claim 8, wherein the n-type and p-type (Al,Ga)N layers, other than the capping layer and barrier layer, are grown near or at approximately 20–150 Torr.

20. A device fabricated using the method of claim 8.

* * * * *

UNITED STATES PATENT AND TRADEMARK OFFICE
CERTIFICATE OF CORRECTION

| | | |
|---|---|---|
| PATENT NO. | : 7,186,302 B2 | Page 1 of 1 |
| APPLICATION NO. | : 11/123805 | |
| DATED | : March 6, 2007 | |
| INVENTOR(S) | : Chakraborty et al. | |

It is certified that error appears in the above-identified patent and that said Letters Patent is hereby corrected as shown below:

Title Page,

Item [73], Assignees,

Lines 2, 3, and 4, "The Agency of Industrial Science and Technology" should read --The Japan Science and Technology Agency--.

Signed and Sealed this

Seventh Day of August, 2007

JON W. DUDAS
*Director of the United States Patent and Trademark Office*